(12) United States Patent
DeRego

(10) Patent No.: US 10,527,682 B1
(45) Date of Patent: *Jan. 7, 2020

(54) SYSTEM AND METHOD USING HYBRID MAGNETIC FIELD MODEL FOR IMAGING MAGNETIC FIELD SOURCES

(71) Applicant: HONEYWELL FEDERAL MANUFACTURING & TECHNOLOGIES, LLC, Kansas City, MO (US)

(72) Inventor: Paul Jeffrey DeRego, Albuquerque, NM (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/144,457

(22) Filed: Sep. 27, 2018

Related U.S. Application Data

(63) Continuation of application No. 15/060,030, filed on Mar. 3, 2016, now Pat. No. 10,114,082.

(51) Int. Cl.
| | |
|---|---|
| *G01V 3/08* | (2006.01) |
| *G01R 33/00* | (2006.01) |
| *G01R 33/02* | (2006.01) |
| *G01V 3/02* | (2006.01) |

(52) U.S. Cl.
CPC ..... *G01R 33/0023* (2013.01); *G01R 33/0094* (2013.01); *G01R 33/02* (2013.01); *G01V 3/02* (2013.01)

(58) Field of Classification Search
CPC . G01V 3/08; G01V 3/081; G01V 3/17; G01V 3/26; G01B 7/004
See application file for complete search history.

(56) References Cited

U.S. PATENT DOCUMENTS

| | | | | |
|---|---|---|---|---|
| 4,710,708 A | * | 12/1987 | Rorden | E21B 47/02224 324/207.26 |
| 4,875,015 A | * | 10/1989 | Ward | G01V 3/20 324/323 |
| 5,485,089 A | * | 1/1996 | Kuckes | E21B 47/02216 175/45 |
| 7,898,494 B2 | * | 3/2011 | Brune | H01Q 1/04 343/866 |

(Continued)

*Primary Examiner* — Jaehwan Oh
(74) *Attorney, Agent, or Firm* — Hovey Williams LLP

(57) ABSTRACT

A system and method for detecting a magnetic field generated by a magnetic field source located in a circuit. A magnetometer array generates data regarding an activity of the source. A computing device executes a magnetic beamforming data processing program including a hybrid model which receives data generated by the array and detects the magnetic field generated by the source. The hybrid model is based on a weighted sum of contributions to the magnetic field, which include a first modelled magnetic field contribution generated by a current dipole aligned with an axis of the source, and a second modelled magnetic field contribution generated by a loop current flowing around the axis. Weighting factors are applied to the modelled fields, and then the weighted modelled fields are summed to produce the hybrid model. The weighting factors can be adjusted to emphasize the contribution of one modelled field over the other.

20 Claims, 3 Drawing Sheets

(56) References Cited

U.S. PATENT DOCUMENTS

| | | | | |
|---|---|---|---|---|
| 2005/0183887 A1* | 8/2005 | Rodney | ............... | E21B 47/04 |
| | | | | 175/26 |
| 2008/0218170 A1* | 9/2008 | Stolarczyk | ............... | G01V 3/17 |
| | | | | 324/330 |
| 2009/0179649 A1* | 7/2009 | Schmidt | ............... | G01V 3/26 |
| | | | | 324/345 |
| 2011/0156957 A1* | 6/2011 | Waite | ............... | G01S 5/0221 |
| | | | | 342/450 |
| 2015/0376493 A1* | 12/2015 | Huh | ............... | C09K 8/58 |
| | | | | 166/252.6 |

\* cited by examiner

SYSTEM AND METHOD USING HYBRID MAGNETIC FIELD MODEL FOR IMAGING MAGNETIC FIELD SOURCES

RELATED APPLICATION

This patent application is a continuation, and claims priority benefit with regard to all common subject matter, of earlier-filed U.S. patent application Ser. No. 15/060,030, filed on Mar. 3, 2016, and entitled "SYSTEM AND METHOD USING HYBRID MAGNETIC FIELD MODEL FOR IMAGING MAGNETIC FIELD SOURCES". The identified earlier-filed patent application is hereby incorporated by reference in its entirety into the present application.

STATEMENT REGARDING FEDERALLY-SPONSORED RESEARCH OR DEVELOPMENT

This invention was made with government support under Contract No.: DE-NA0002839 awarded by the Department of Energy. The government has certain rights in the invention.

FIELD

The present invention relates to systems and methods for detecting magnetic field sources, and, more particularly, to a system and method of using a hybrid magnetic field model for imaging magnetic field sources such as solenoids in electronic circuits.

BACKGROUND

Solenoids produce strong magnetic fields which are difficult to contain, so detection and characterization of those fields can provide information regarding the location and activity of electronic circuits containing solenoids. Successful use of linearly constrained minimum variance (LCMV) magnetic beamforming to image an unknown configured current source depends on how well the measurement model represents the real current source that generated the observed magnetic field. For example, if the current source is a solenoid whose axis is oriented toward a measurement plane of a magnetometer array, then the magnetic flux lines will cut perpendicularly through the measurement plane along the axis and will be densest around the axis. A dipole current model cannot represent this observed field. Thus, while magnetic beamforming magnetometer arrays and data processing algorithms exist for imaging biomagnetic activity within the brain, these technologies include mathematical models for dipole current sources which are inappropriate for imaging the solenoid magnetic field generators found in electronic circuits.

This background discussion is intended to provide information related to the present invention which is not necessarily prior art.

SUMMARY

Embodiments of the present invention solve the above-described and other problems and limitations by providing a system and computer-implemented method for detecting a magnetic field generated by a magnetic field source, such as may be located in an electronic circuit. More specifically, the present invention improves the performance of a beamforming imager by replacing the prior art dipole model with a more representative hybrid model.

In an embodiment of the present invention, a system is provided for detecting a magnetic field generated by a magnetic field source which may be located in an electronic circuit. The system may broadly include a magnetometer array and a computing device. The magnetometer array may be configured to generate data regarding an activity of the magnetic field source. The computing device may be configured to execute a magnetic beamforming data processing program including a hybrid model configured to receive the data generated by the magnetometer array and to detect the magnetic field generated by the magnetic field source. The hybrid model may be based on a weighted sum of a plurality of contributions to the magnetic field, which may include a first modelled magnetic field contribution generated by a current dipole aligned with an axis of the magnetic field source, and a second modelled magnetic field contribution generated by a loop current flowing around the axis of the magnetic field source. A first weighting factor may be applied to the first modelled contribution and a second weighting factor may be applied to the second modelled contribution, and then the weighted first and second modelled contributions may be summed to produce the hybrid model.

In another embodiment of the present invention, a computer-implemented method is provided for detecting a magnetic field generated by a magnetic field source which may be located in an electronic circuit. The computer-implemented method may broadly comprise the following steps. A computing device may receive data generated by a magnetometer array regarding an activity of the magnetic field source. The computing device may execute a magnetic beamforming data processing program including a hybrid model configured to receive the data generated by the magnetometer array and to detect the magnetic field generated by the magnetic field source. The hybrid model may be based on a weighted sum of a plurality of contributions to the magnetic field including a first modelled magnetic field contribution generated by a current dipole aligned with an axis of the magnetic field source, and a second modelled magnetic field contribution generated by a loop current flowing around the axis of the magnetic field source. A first weighting factor may be applied to the first modelled contribution and a second weighting factor may be applied to the second modelled contribution, and then the weighted first and second modelled contribution may be summed to produce the hybrid model. The computing device may report detection of the magnetic field generated by the magnetic field source.

Various configurations of the foregoing embodiments may include any one or more of the following additional features. The magnetic field source may be a solenoid. The magnetometer array may be a 232 channel magnetometer array. The hybrid model may provide a linear mathematical relationship between a hypothetical magnetic field source of generalized position, shape, and orientation and an accurate computation of a generated magnetic flux density vector at any three-space measurement position external to the magnetic field source. The first weighting factor may be between 0 and 1, and the second weighting factor may be determined as 1 minus the first weighting factor. The first weighting factor may be adjustable such that lowering the first weighing factor emphasizes the first modelled magnetic field contribution by producing a magnetic field pattern dominated by currents aligned with a moment vector, and raising the first weighting factor emphasizes the second modelled magnetic field contribution by producing the magnetic field pattern dominated by currents circulating around the moment vector.

In exemplary applications of the present invention, the system and/or method may locate and image the magnetic field source which may be located in a closed container and may have any orientation within the closed container relative to the magnetometer array. The magnetic field source may be a transformer assembly, and the system and/or method may be configured to determine an orientation and inspect a wiring of the transformer assembly. The system and/or method may be configured to image a geophysical subsurface conductivity.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment", "an embodiment", or "embodiments" mean that the feature or features referred to are included in at least one embodiment of the invention. Separate references to "one embodiment", "an embodiment", or "embodiments" in this description do not necessarily refer to the same embodiment and are not mutually exclusive unless so stated. Specifically, a feature, structure, act, etc. described in one embodiment may also be included in other embodiments, but is not necessarily included. Thus, particular configurations of the present invention can include a variety of combinations and/or integrations of the embodiments described herein.

Broadly characterized, the present invention provides a system and computer-implemented method for detecting a magnetic field generated by a magnetic field source, such as may be located in an electronic circuit. The present invention improves the performance of a beamforming imager by replacing the prior art dipole model with a more representative hybrid model. The hybrid model allows the beamforming imager system to localize and image magnetic field sources of substantially any orientation.

Figure 1:
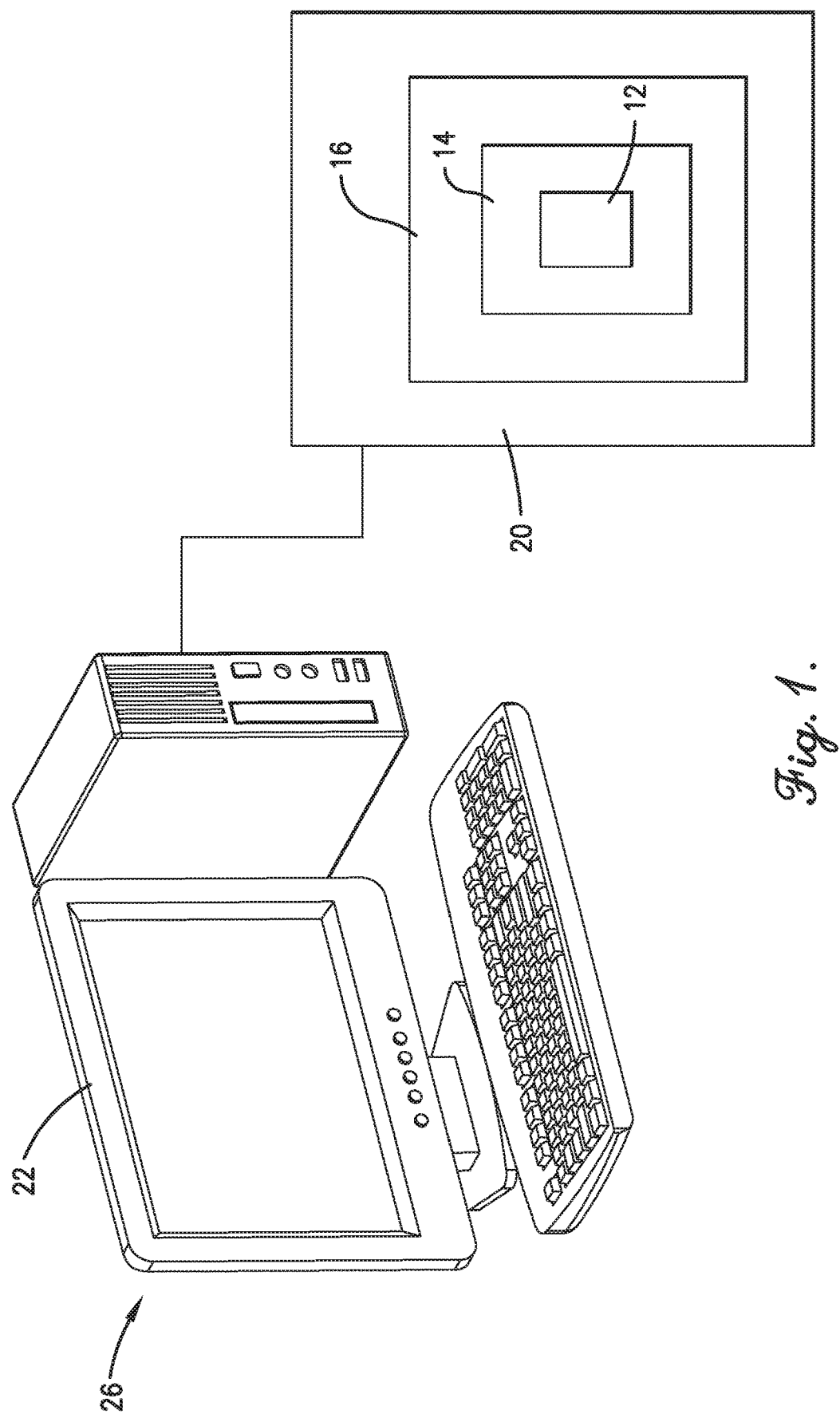
FIG. 1 is a block diagram of an embodiment of a beamforming imager system for detecting a magnetic field generated by a magnetic field source.

Referring to FIG. 1, an embodiment of a beamforming imager system 10 may be configured to detect a magnetic field generated by a magnetic field source 12, such as a solenoid, which may be located in an electronic circuit 14 which may, in turn, be located in a closed container 16. The system 10 may broadly comprise a magnetometer array 20 and a computing device 22. The magnetometer array 20 may be configured to generate data regarding an activity of the magnetic field source. In one implementation, the magnetometer array 20 may be a 232 channel magnetometer array.

Figure 2:
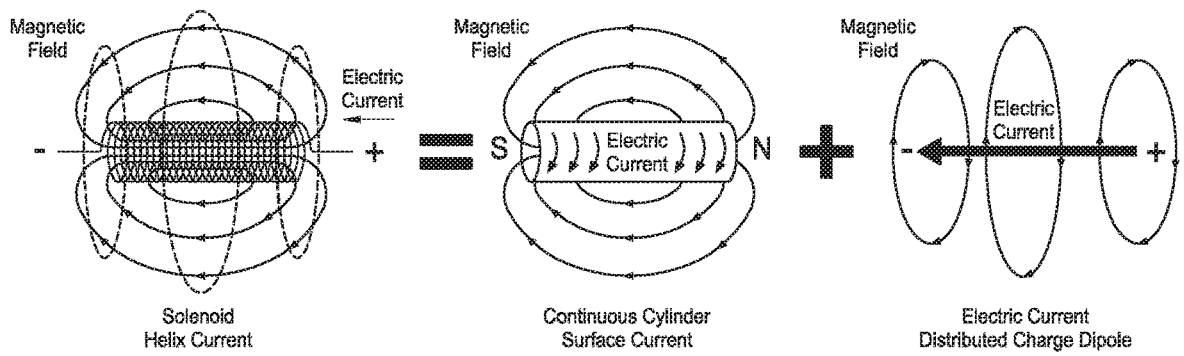
FIG. 2 is a representation of a first modelled magnetic field contribution associated with the magnetic field generated by the magnetic field source.
Figure 3:
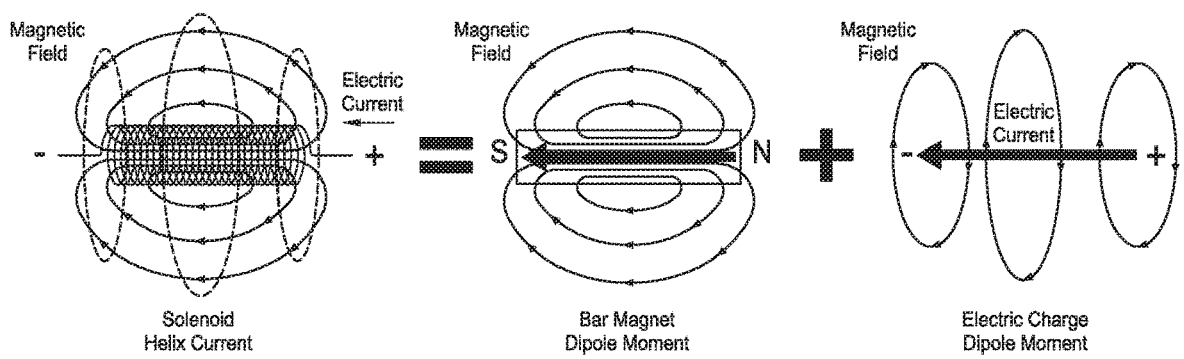
FIG. 3 is a representation of a second modelled magnetic field contribution associated with the magnetic field generated by the magnetic field source.
Figure 4:
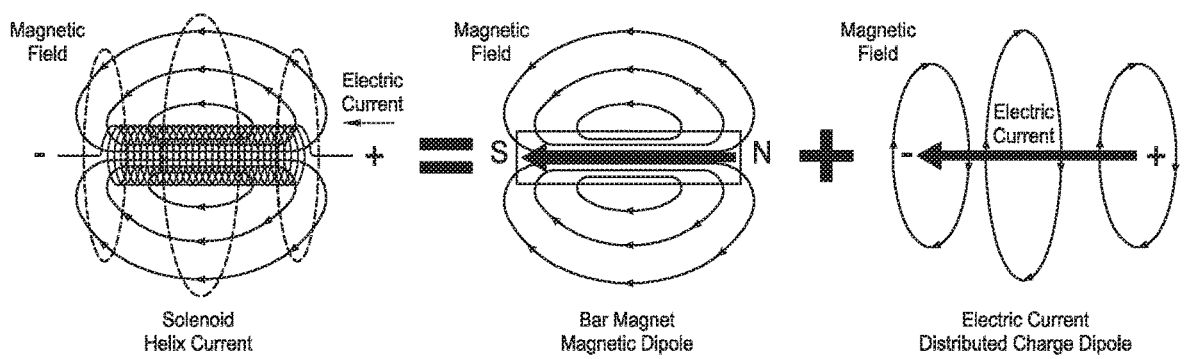
FIG. 4 is a hybrid model combining the first and second modelled magnetic field contributions of FIGS. 2 and 3.

The computing device 22 may be configured to execute a magnetic beamforming data processing program including a hybrid model configured to receive the data generated by the magnetometer array 20 and to detect the magnetic field generated by the magnetic field source 12. Referring also to FIGS. 2, 3, and 4, the hybrid model 26 (seen in FIG. 4) may be based on a weighted sum of a plurality of contributions to the magnetic field, including a first modelled magnetic field contribution 28 (seen in FIG. 2) generated by a current dipole aligned with an axis of the magnetic field source, and a second modelled magnetic field contribution 30 (seen in FIG. 3) generated by a loop current flowing around the axis of the magnetic field source. A first weighting factor may be applied to the first modelled contribution 26 and a second weighting factor may be applied to the second modelled contribution 28, and then the weighted first and second modelled contributions 26,28 may be summed to produce the hybrid model 26.

Broadly, the hybrid model 26 as a function of the solenoid moment vector may be formulated as a weighted sum of the two magnetic field contributions: The first modelled magnetic field contribution 28 generated by a current dipole aligned with the solenoid axis, and the second modelled magnetic field contribution 30 generated by a loop current flowing around the solenoid axis. The hybrid model 26 provides a linear mathematical relationship between a solenoid of generalized position, shape, and orientation and an accurate computation of the generated magnetic flux density vector at any three-space measurement position external to the solenoid. A magnetometer array 20 using the magnetic beamforming data processing algorithm implementing the hybrid model 26 may then be able to image the three-space location of the solenoid.

In more detail, the hybrid model 26 may be formed by first recognizing that the magnetic field generated by a solenoid can be accurately modelled as the sum of an infinite number of infinitesimal length current dipoles distributed along the length of the solenoid's helical path. However, this integral sum may not be computable without knowledge of the solenoid length, diameter, number of coil turns, three-space orientation, and three-space position. A generalized point source solenoid model accurate for the external magnetic field at positions greater than about the size of the solenoid can be formed by summing together two modelled contributors. The first contributor is electrical surface current flowing around a continuous cylinder modelling the tangential component of the solenoid current flow. The second contributor is the average electrical moving in the direction parallel to the solenoid axis. This crucial current is modelled as a distributed charge or current dipole moment. Next, it may be recognized that the cylindrical surface current field can be modelled as a magnetic dipole moment coincident in position and orientation with the solenoid axis. The hybrid model 26 then reduces to the sum of two coincident moment vectors, the current dipole moment and magnetic dipole moment. Both the current dipole moment and the magnetic dipole moment can be expressed as a function of their respective moment vectors from prior art vector equations. The present invention combines these prior art equations in a weighted sum of current magnetic moment.

To balance the contributions of the two fields, the weighting factor, $\gamma$, which may be a value between 0 and 1, may be applied to the magnetic moment contribution, and $1-\gamma$ may be applied to the current moment contribution. Setting $\gamma$ to smaller values approaching 0 produces a magnetic field pattern dominated by currents aligned with the moment vector, effectively transitioning the model to a long and narrow solenoid which becomes a current dipole at $\gamma=0$. Setting $\gamma$ to larger values approaching 1 produces a magnetic field pattern dominated by currents circulating around the moment vector, effectively transitioning the model to a short solenoid which resembles a single loop at $\gamma=1$. The weighting factor may be thought of as transitioning the vector $\bar{p}$ from an electric current dipole moment at $\gamma=0$ to a magnetic dipole moment at $\gamma=1$. Thus, by adjusting $\gamma$ closer to 0 or closer to 1, one model can be emphasized over the other, which has the effect of lengthening or shortening the point solenoid magnetic field generator.

The moment vector may be factored out of the summation equation to form a matrix equation describing a scaled version of the solenoid's external magnetic field as a linear function of the solenoid moment vector. The hybrid model's system matrix is a function of the solenoid's three-space position and the solenoid's new shape parameter $\gamma$. An additive measurement noise term can be added to the equation for use in realistic modelling application.

Thus, the solenoid helix current may be represented by the bar magnet magnetic dipole combined with the electric current distributed charge dipole:

$$\frac{\mu_o}{4\pi r^3} \begin{bmatrix} \left(3\frac{r_X^2 p_X + r_X r_Y p_Y + r_X r_Z p_Z}{r^2} - p_X\right)\gamma + (p_Y r_Z - p_Z r_Y)\cdot(1-\gamma) \\ \left(3\frac{r_X r_Y p_X + r_Y^2 p_Y + r_Y r_Z p_Z}{r^2} - p_Y\right)\gamma + (p_Z r_X - p_X r_Z)\cdot(1-\gamma) \\ \left(3\frac{r_X r_Z p_X + r_Y r_Z p_Y + r_Z^2 p_Z}{r^2} - p_Z\right)\gamma + (p_X r_Y - p_Y r_X)\cdot(1-\gamma) \end{bmatrix} =$$

$$\frac{\mu_o}{4\pi r^3} \begin{bmatrix} \left(3\frac{r_X^2 p_X + r_X r_Y p_Y + r_X r_Z p_Z}{r^2} - p_X\right) \\ \left(3\frac{r_X r_Y p_X + r_Y^2 p_Y + r_Y r_Z p_Z}{r^2} - p_Y\right) \\ \left(3\frac{r_X r_Z p_X + r_Y r_Z p_Y + r_Z^2 p_Z}{r^2} - p_Z\right) \end{bmatrix}\gamma +$$

$$\frac{\mu_o}{4\pi r^3} \begin{bmatrix} (p_Y r_Z - p_Z r_Y) \\ (p_Z r_X - p_X r_Z) \\ (p_X r_Y - p_Y r_X) \end{bmatrix}\cdot(1-\gamma)$$

These can be re-arranged into matrix form to provide the hybrid model of the magnetic flux density vector as a linear function of the source moment vector plus an additive noise vector:

$$\begin{bmatrix} B_X \\ B_Y \\ B_Z \end{bmatrix} =$$

$$\frac{\mu_o}{4\pi r^3} \begin{bmatrix} \left(3\frac{r_X^2}{r^2}-1\right)\gamma & 3\frac{r_X r_Y \gamma}{r^2}+r_Z(1-\gamma) & 3\frac{r_X r_Z \gamma}{r^2}-r_Y(1-\gamma) \\ 3\frac{r_X r_Y \gamma}{r^2}-r_Z(1-\gamma) & \left(3\frac{r_Y^2}{r^2}-1\right)\gamma & 3\frac{r_Y r_Z \gamma}{r^2}+r_X(1-\gamma) \\ 3\frac{r_X r_Z \gamma}{r^2}+r_Y(1-\gamma) & 3\frac{r_Y r_Z \gamma}{r^2}-r_X(1-\gamma) & \left(3\frac{r_Z^2}{r^2}-1\right)\gamma \end{bmatrix}$$

$$\begin{bmatrix} p_X \\ p_Y \\ p_Z \end{bmatrix} + \begin{bmatrix} n_X \\ n_Y \\ n_Z \end{bmatrix}$$

wherein, $\mu_O$ is the permeability of free space; $\bar{p}$ is the source moment (strength and orientation; and r is the measurement position from the dipole source.

Figure 5:
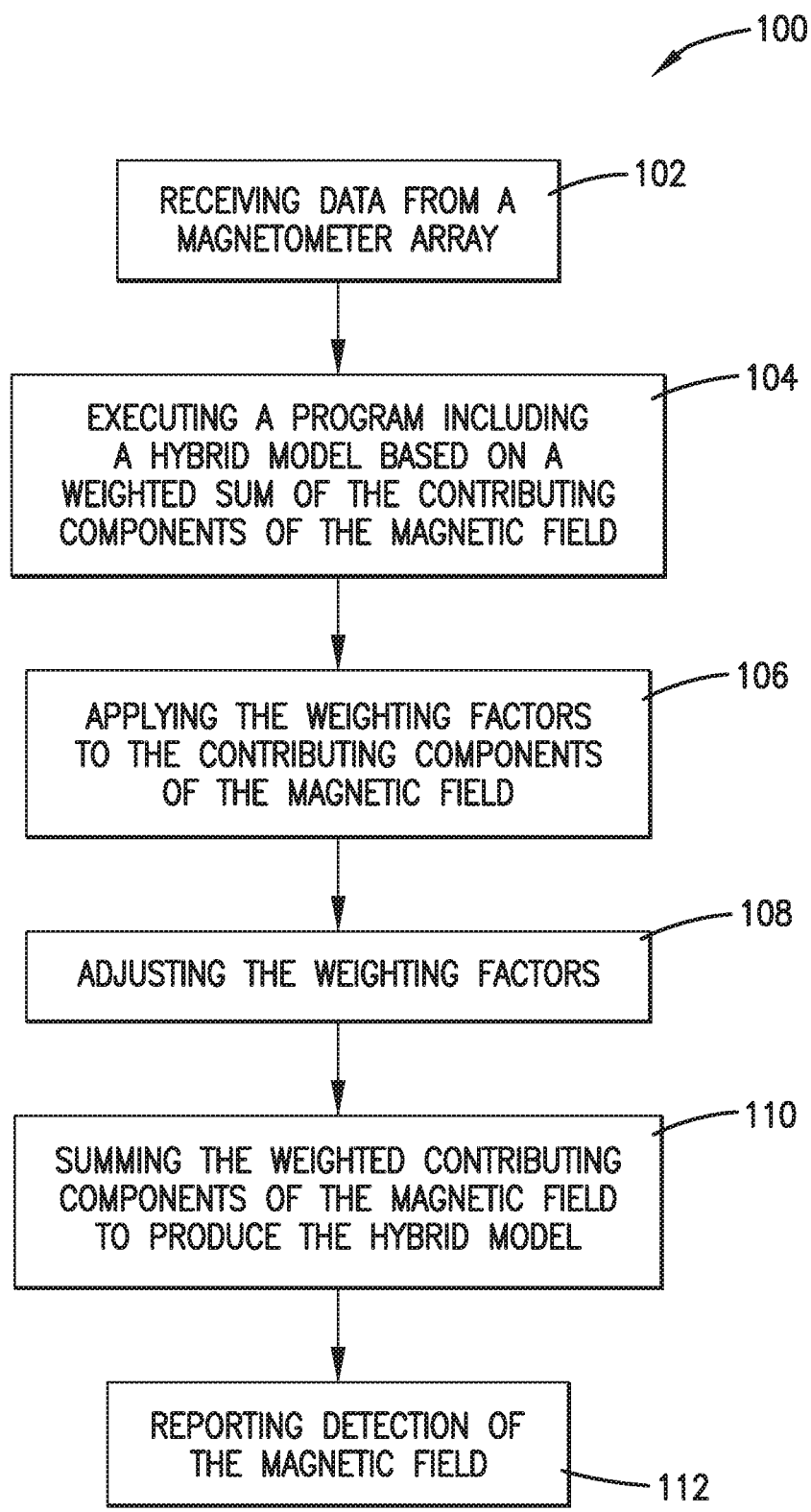
FIG. 5 is a flowchart of steps involved in an embodiment of a computer-implemented method for detecting the magnetic field generated by the magnetic field source.

Referring also to FIG. 5, an embodiment of a computer-implemented method 100 for detecting the magnetic field generated by the magnetic field source 12, such as a solenoid, which may be located in the electronic circuit 14 which may, in turn, be located in the closed container 16, may broadly comprise the following steps. The computing device 22 may receive data generated by the magnetometer array 20 regarding an activity of the magnetic field source 12, as shown in 102. The computing device 22 may execute the magnetic beamforming data processing program including the hybrid model 26 configured to receive the data generated by the magnetometer array 20 and to detect the magnetic field generated by the magnetic field source 12, as shown in 104. The hybrid model 26 may be based on the weighted sum of the plurality of contributions to the magnetic field including the first modelled magnetic field contribution 28 generated by a current dipole aligned with an axis of the magnetic field source 12, and the second modelled magnetic field contribution 30 generated by a loop current flowing around the axis of the magnetic field source 12. The first weighting factor may be applied to the first modelled contribution 26 and the second weighting factor may be applied to the second modelled contribution 28, as shown in 106, and then the weighted first and second modelled contributions 26,28 may be summed to produce the hybrid model 26, as shown in 108. The computing device 22 may report detection of the magnetic field generated by the magnetic field source 12, as shown in 110.

The method 100 may further include the step of adjusting the first weighting factor, as shown in 112, either by lowering it to emphasize the first modelled magnetic field contribution 26 by producing a magnetic field pattern dominated by currents aligned with a moment vector, or by raising it to emphasize the second modelled magnetic field contribution 30 by producing the magnetic field pattern dominated by currents circulating around the moment vector.

The hybrid model 26 has been implemented and shown to be more appropriate for imaging solenoid sources than the prior art's dipole current model. One use for the present invention is to passively image magnetic field sources. For example, it may be desirable to detect and track active power sources in containers that preclude visual inspection. Other uses include testing transformer assemblies for, e.g., proper orientation and wiring, and imaging geophysical subsurface conductivity.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. A system for detecting a magnetic field generated by a magnetic field source, the system comprising:
  a computing device configured to execute a magnetic beamforming data processing program including a hybrid model configured to detect the magnetic field generated by the magnetic field source, the hybrid model being based on a weighted sum of a plurality of contributions to the magnetic field including:
    a first modelled magnetic field contribution generated by a current dipole aligned with an axis of the magnetic field source, and
    a second modelled magnetic field contribution generated by a loop current flowing around the axis of the magnetic field source, a first weighting factor being applied to the first modelled magnetic field contribution and a second weighting factor being applied to the second modelled magnetic field contribution, at least the weighted first and second modelled magnetic field contributions being summed to produce the hybrid model.

2. The system as set forth in claim 1, wherein the magnetic field source is a solenoid.

3. The system as set forth in claim 1, wherein the computing device is configured to receive magnetic field data from a 232 channel magnetometer array.

4. The system as set forth in claim 1, wherein the hybrid model provides a linear mathematical relationship between a hypothetical magnetic field source of generalized position, shape, and orientation and an accurate computation of a generated magnetic flux density vector at any three-space measurement position external to the magnetic field source.

5. The system as set forth in claim 1, wherein the first weighting factor is between 0 and 1, and the second weighting factor is determined as 1 minus the first weighting factor.

6. The system as set forth in claim 1, wherein the first weighting factor is adjustable such that:
  lowering the first weighting factor emphasizes the first modelled magnetic field contribution by producing a magnetic field pattern dominated by currents aligned with a moment vector; and
  raising the first weighting factor emphasizes the second modelled magnetic field contribution by producing the magnetic field pattern dominated by currents circulating around the moment vector.

7. The system as set forth in claim 1, wherein the system is configured to locate and image the magnetic field source, the magnetic field source being located in and having any orientation within a closed container.

8. The system as set forth in claim 1, wherein the magnetic field source is a transformer assembly, and the system is configured to determine an orientation and inspect a wiring of the transformer assembly.

9. The system as set forth in claim 1, wherein the system is configured to image a geophysical subsurface conductivity.

10. A beamforming imager system for passively detecting a magnetic field generated by a solenoid which is located in an electronic circuit, the system comprising:
  a computing device configured to execute a magnetic beamforming data processing program including a hybrid model configured to detect the magnetic field generated by the solenoid, the hybrid model being based on a weighted sum of a plurality of contributions to the magnetic field including:
    a first modelled magnetic field contribution generated by a current dipole aligned with an axis of the solenoid, and
    a second modelled magnetic field contribution generated by a loop current flowing around the axis of the solenoid, a first weighting factor being between 0 and 1 and being applied to the first modelled magnetic field contribution and a second weighting factor being 1 minus the first weighting factor and being applied to the second modelled magnetic field contribution, at least the weighted first and second modelled magnetic field contributions being summed to produce the hybrid model.

11. The beamforming imager system as set forth in claim 10, wherein the computing device is configured to receive magnetic field data from a 232 channel magnetometer array.

12. The beamforming imager system as set forth in claim 10, wherein the first weighting factor is adjustable such that:
  lowering the first weighing factor emphasizes the first modelled magnetic field contribution by producing a magnetic field pattern dominated by currents aligned with a moment vector; and
  raising the first weighting factor emphasizes the second modelled magnetic field contribution by producing the magnetic field pattern dominated by currents circulating around the moment vector.

13. The beamforming imager system as set forth in claim 10, wherein the beamforming imager system is configured to locate and image the solenoid, the solenoid being located in and having any orientation within a closed container.

14. A computer-implemented method for detecting a magnetic field generated by a magnetic field source, the computer-implemented method comprising:
  executing on a computing device a magnetic beamforming data processing program including a hybrid model configured to detect the magnetic field generated by the magnetic field source, the hybrid model being based on a weighted sum of a plurality of contributions to the magnetic field including:
    a first modelled magnetic field contribution generated by a current dipole aligned with an axis of the magnetic field source, and
    a second modelled magnetic field contribution generated by a loop current flowing around the axis of the magnetic field source;
  applying via the magnetic beamforming data processing program a first weighting factor to the first modelled magnetic field contribution;
  applying via the magnetic beamforming data processing program a second weighting factor to the second modelled magnetic field contribution; and
  summing via the magnetic beamforming data processing program at least the weighted first and second modelled magnetic field contributions so as to produce the hybrid model.

15. The computer-implemented method as set forth in claim 14, wherein the magnetic field source is a solenoid.

16. The computer-implemented method as set forth in claim 14, further comprising receiving via the computer device magnetic field data from a 232 channel magnetometer array.

17. The computer-implemented method as set forth in claim 14, wherein the hybrid model provides a linear mathematical relationship between a hypothetical solenoid of generalized position, shape, and orientation and an accurate computation of a generated magnetic flux density vector at any three-space measurement position external to the solenoid.

18. The computer-implemented method as set forth in claim 14, wherein the first weighting factor is between 0 and 1, and the second weighting factor is determined as 1 minus the first weighting factor.

19. The computer-implemented method as set forth in claim 14, further including adjusting the first weighting factor such that:
   lowering the first weighting factor emphasizes the first modelled magnetic field contribution by producing a magnetic field pattern dominated by currents aligned with a moment vector; and
   raising the first weighting factor emphasizes the second modelled magnetic field contribution by producing the magnetic field pattern dominated by currents circulating around the moment vector.

20. The computer-implemented method as set forth in claim 14, further comprising locating and imaging the magnetic field source in a closed container, the magnetic field source having any orientation within the closed container.

\* \* \* \* \*